(12) United States Patent
Binder et al.

(10) Patent No.: US 8,255,846 B2
(45) Date of Patent: Aug. 28, 2012

(54) DEVELOPMENT TOOL FOR COMPARING NETLISTS

(75) Inventors: William Alan Binder, Morrisville, NC (US); Harry I. Linzer, Raleigh, NC (US); Llewellyn Bradley Marshall, IV, Cary, NC (US); William Appleton Rose, Wake Forest, NC (US)

(73) Assignee: International Business Machines Corporation, Armonk, NY (US)

( * ) Notice: Subject to any disclaimer, the term of this patent is extended or adjusted under 35 U.S.C. 154(b) by 405 days.

(21) Appl. No.: 12/543,301

(22) Filed: Aug. 18, 2009

(65) Prior Publication Data

US 2011/0047521 A1    Feb. 24, 2011

(51) Int. Cl.
*G06F 17/50* (2006.01)

(52) U.S. Cl. ......... 716/104; 716/101; 716/126; 716/139

(58) Field of Classification Search .................. 716/101, 716/104, 126, 139
See application file for complete search history.

(56) References Cited

U.S. PATENT DOCUMENTS

| 7,240,312 | B2 | 7/2007 | Dang |
| 7,404,161 | B2 | 7/2008 | Dutt et al. |
| 2005/0278667 | A1 | 12/2005 | Boucher |
| 2007/0011632 | A1 | 1/2007 | Yang |
| 2009/0228849 | A1* | 9/2009 | Mossawir et al. .................. 716/5 |

* cited by examiner

*Primary Examiner* — Thuan Do
(74) *Attorney, Agent, or Firm* — Wenjie Li; Josh Cockburn

(57) ABSTRACT

System, method, and program product analyze netlists for related electrical circuit designs by comparing predefined physical characteristics between the netlists. A baseline reference score is generated for one of the netlists and a normalized score is generated for the other netlist. The baseline reference score and the normalized score are used to generate a similarity score that is displayed on a display monitor. Preferably, the similarity score is displayed as a percentage.

20 Claims, 6 Drawing Sheets

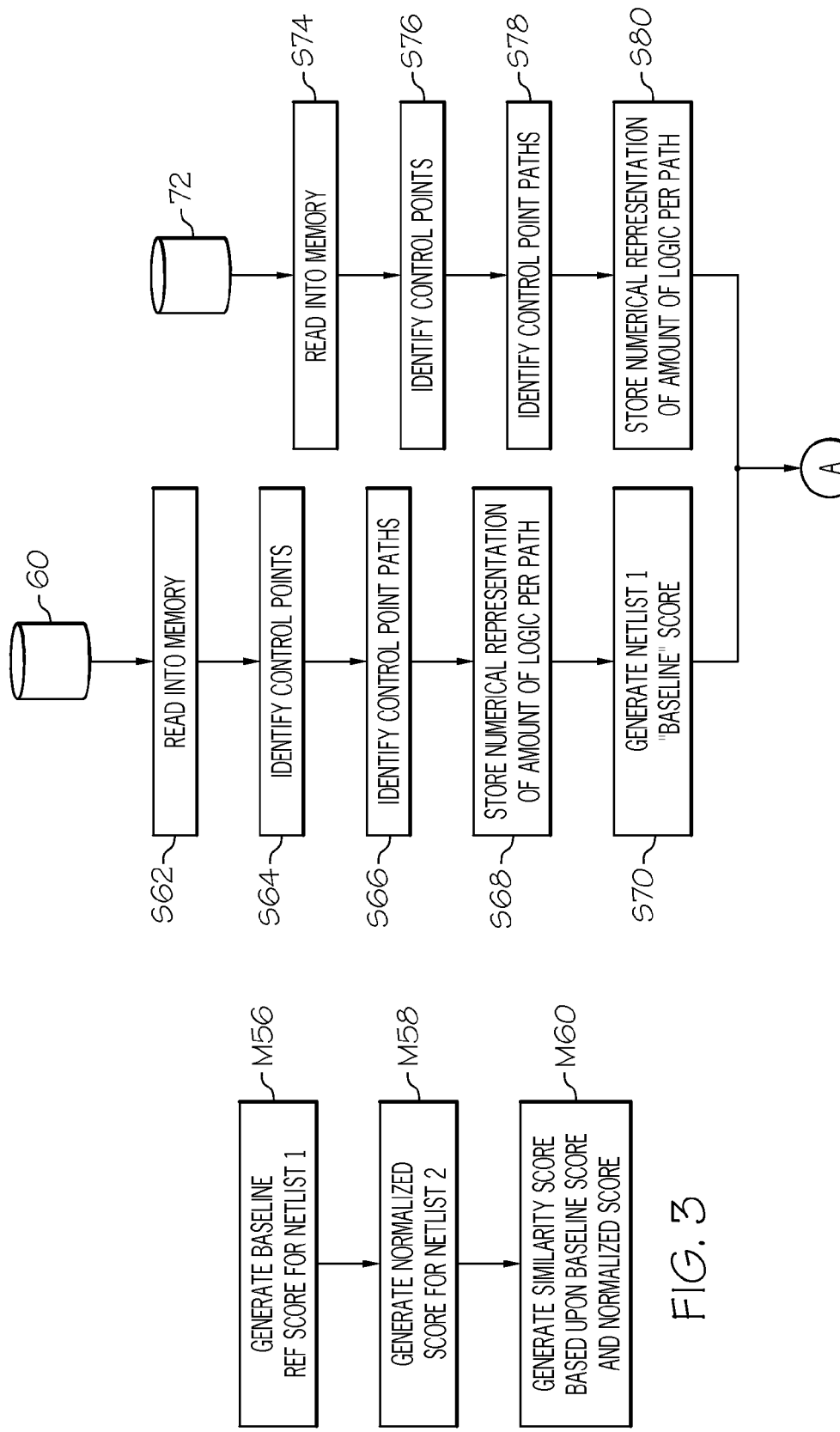

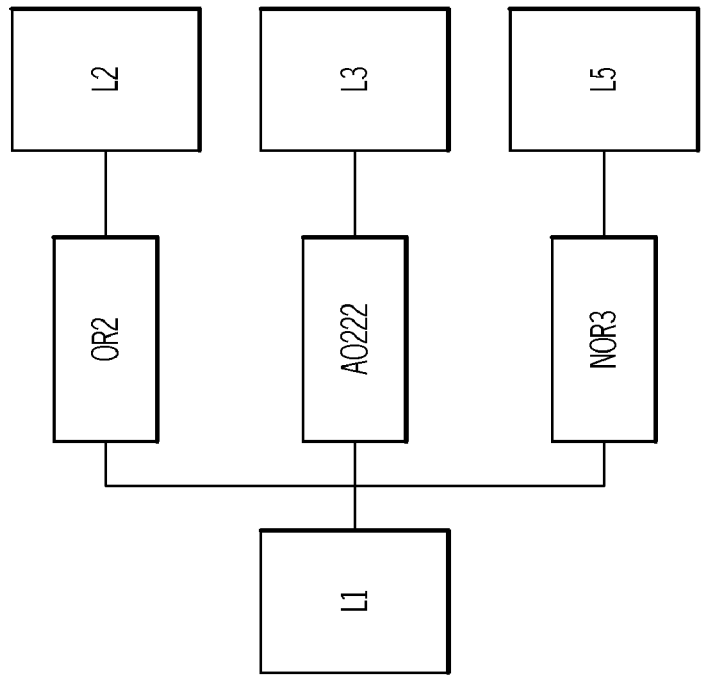
FIG. 5B1
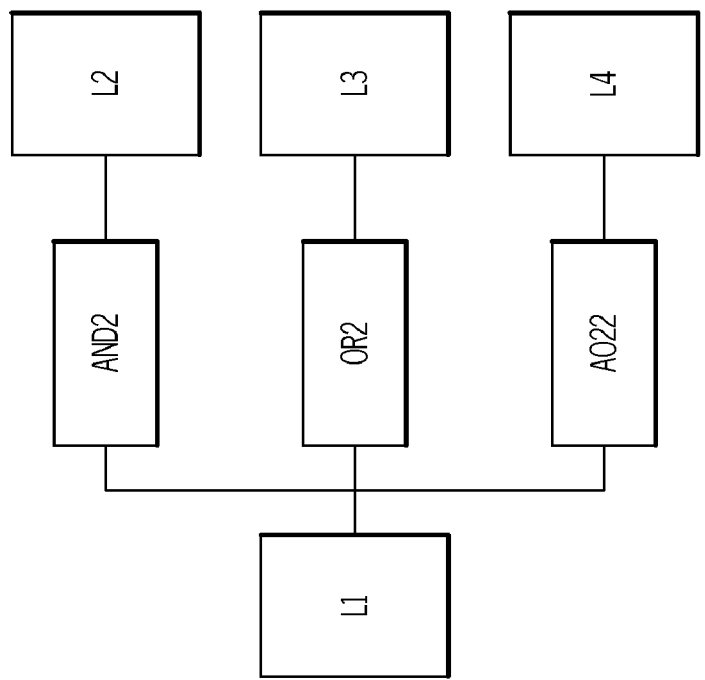
FIG. 5A1

| PATHS | CTRL POINTS | LOGIC | BASELINE WIEGHT FACTOR (BWF) |
|---|---|---|---|
|  | L1 | LATCH | 4 |
| L1 TO L2 |  | AND2 | 2 |
| L1 TO L3 |  | OR2 | 2 |
| L1 TO L4 |  | AO22 | 2 |

FIG. 5A2

| PATHS | CTRL POINTS | LOGIC | NORMALIZED WIEGHT FACTOR (NWF) |
|---|---|---|---|
|  | L1 | LATCH | 4 |
| L1 TO L2 |  | OR2 | 2 |
| L1 TO L3 |  | AO222 | 1 |
| L1 TO L5 |  | NOR3 | -2 |

FIG. 5B2

DEVELOPMENT TOOL FOR COMPARING NETLISTS

TECHNICAL FIELD

The present invention relates to circuit design services, in general, and in particular, to tools used to develop said circuit designs.

DESCRIPTION OF THE RELATED ART

It is common practice in the electronic industry for Original Equipment Manufacture (OEM) and others to have third party Design Centers (hereafter termed Design Center) develop an entire electrical system or portion thereof. The electrical system may include a complex system, such as a microprocessor, or a relatively simple system, such as a piece of combinatorial logic. Usually, the Design Center has expertise in the technology to which the electrical system relates.

A netlist for the electrical system or electrical circuit is prepared by the OEM client or designers at the Design Center, based upon client's input. The netlist may be regarded as a textual representation of the electrical circuit to which it relates. A written or verbal inquiry is often made to determine how the new netlist, for the new design, relates to a prior netlist, for a prior related design. Two examples are where the new netlist is a re-spin of the prior netlist that had been manufactured, and where the new netlist is a refinement of the prior netlist from a previous stage in the design schedule. The initial determination of the new versus the prior relationship may be disclosed to the design center by the client or the Design Center may have knowledge on its own regarding the relationship. The difference between the prior netlist and the new netlist may be minor or major. For example, the changes may require all or any of the following: deleting a piece of logic, adding a new piece of logic, resynthesizing a piece of logic, or redesigning all or part of the prior netlist.

Formal Verification tools have been used to assess only the functionality of two netlists. Formal Verification says two netlists are functionally identical, or lists the places where they are not. These tools are most effective when a few or no functional differences were added or deleted from the old design. In addition, Formal Verification tools use a relatively large amount of time and resources to perform the analysis.

Whether the changes are minor or significant it is desirable to have a tool that analyzes the prior netlist and the new netlist to provide accurate information regarding the relationship. In addition, the tool should accomplish the task in a relatively short period of time. This information is not intended to provide an accurate logical equivalence comparison, such as a Formal Verification tool would perform. Instead, the intent is to provide sufficient information to estimate the Design Center resources and schedule required to complete the processing task for the new netlist based upon knowledge of the prior netlist.

SUMMARY OF THE INVENTION

The invention provides a system, method and program product (tool) that compare the physical characteristics of the new netlist (hereafter Netlist 2) with a prior netlist (hereafter Netlist1), and generate a similarity score based on the comparison and display the score, preferably as a percentage, on a display monitor. The similarity score is beneficial and can be used in many ways (some of which are set forth herein) to improve the design cycle. This invention performs a structural analysis of two netlists, not a functional analysis. As a consequence, the invention completes its analysis using only a small fraction of the time and resources required for Formal Verification.

In particular, the invention partitions Netlist 1 and Netlist 2 into control points, paths, and logic gates. Control points in Netlist 1 that are substantially similar to control points in Netlist 2 are identified and used to determine paths in each of the netlists. The control points and paths in Netlist 1 are assigned numerical values which are summed to generate a baseline score. Netlist 2 is examined relative to it being physically similar to Netlist 1, and the comparison process creates values that are referred to as "normalized". Those normalized values are assigned to control points and paths in Netlist 2 based upon their similarities to control points and paths in Netlist 1. A normalized score, for Netlist 2, is generated from the assigned normalized values. A similarity score is generated from the baseline score and the normalized score. Preferably, the similarity score is expressed as a percentage and displayed on a monitor and/or printed on a printer.

Other systems, methods, program products, features, and advantages of the present invention will be or become apparent for one with skill in the art upon examination of the following drawings and detailed description.

BRIEF DESCRIPTION OF DRAWINGS

FIG. 3 depicts a flow chart of functional modules for implementing the generate module of FIG. 2.

FIG. 4, including FIGS. 4*a* and 4*b*, shows a flow chart of a method for implementing an embodiment of the invention.

FIG. 5, including FIGS. 5*a*1, 5*a*2, 5*b*1 and 5*b*2, depicts an example demonstrating part of a previous electrical circuit design and a new electrical circuit design comparison according to teachings of the present invention.

DETAILED DESCRIPTION

Figure 1:
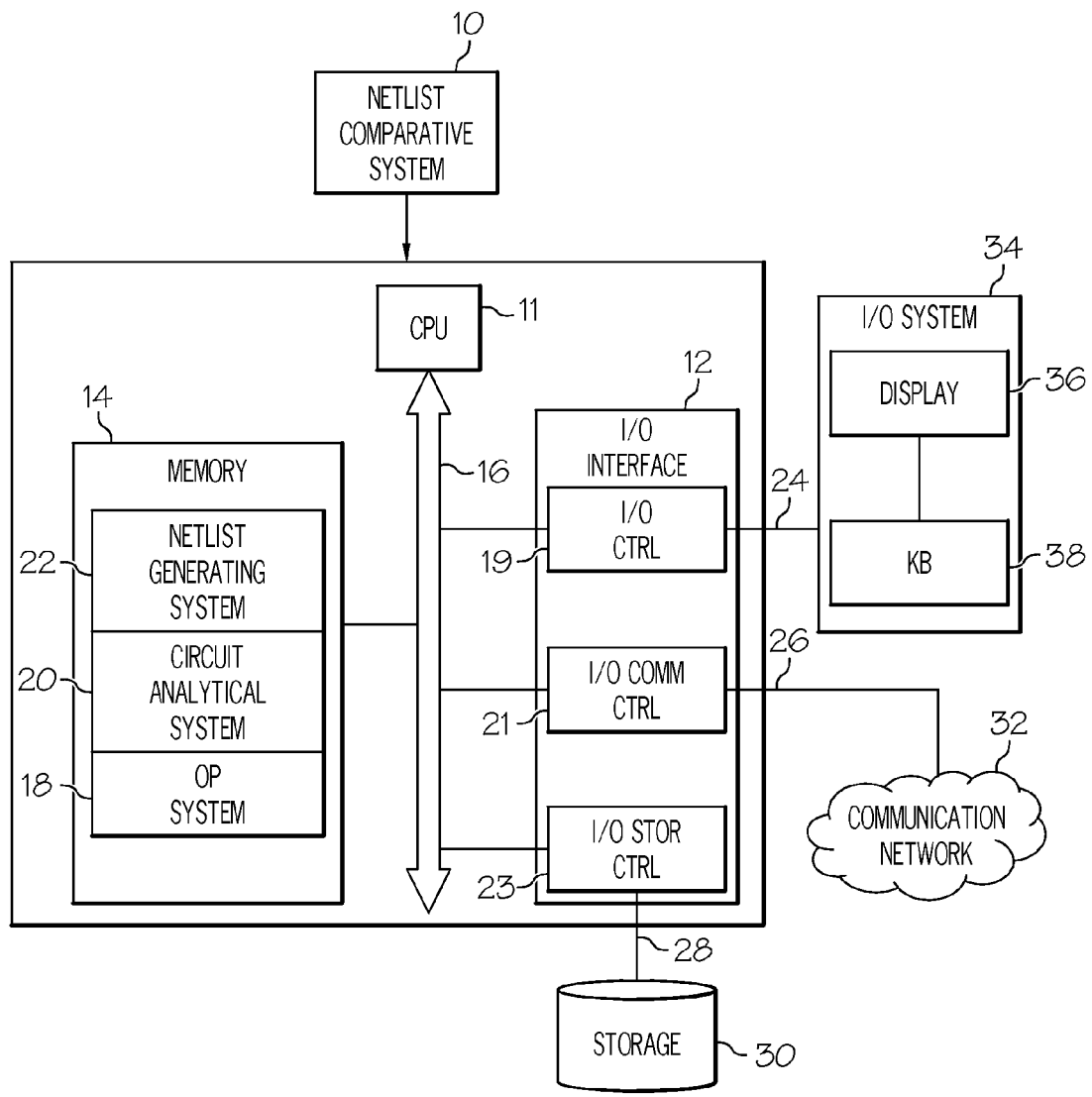
FIG. 1 depicts an illustrative electrical system for implementing various embodiments of the invention.

FIG. 1 shows a schematic of netlist comparative system 10 according to teachings of the present invention. The comparative system may be viewed as a computer executing an application program (details set forth below) that analyzes two netlists, each one representing a textual description of a related circuit design, and outputs a similarity score which is displayed on a monitor and/or printed on a printer. The similarity score has several benefits, some of which are set forth below. The application program is embedded and/or recorded in a computer usable medium, such as a memory or the like.

Still referring to FIG. 1, the netlist comparative system 10 includes CPU 11, I/O Interface 12, Memory 14, and Bus 16 interconnecting named components. Memory 14 includes operating (OP) system 18, circuit analytical system 20, and netlist generating system 22. OP system 18 may be any of the well known operating systems used to control a conventional computer. As a consequence, further description of the OP system will not be given. Circuit Analytical System 20 is the heart of the invention. The details of this analytical system are set forth below. In this context, Analytical System 20 analyzes a prior netlist and a new netlist and outputs a similarity score which can be used in many different ways, some of which are set forth below. Netlist generating system 22 may be used to generate the netlists. For example, Synopsis Design Compiler or Cadence RC commercial systems can be used to generate the netlists. It should be noted that the netlist generating system need not be part of the computer. Instead, it could be remotely located and coupled to the computer via a communications network, such as the Internet or a similar network. In this remote configuration, the netlists could be transmitted over the communications network to the computer.

The I/O interface 12 is coupled by transmission links 24, 26 and 28 to I/O System 34, Communications Network 32, and storage 30. It includes I/O Controllers 19, 21, and 23. Each of the I/O Controllers provides connectivity between the CPU and the external entity to which it is connected. For example, I/O controller_(CTRL) 19 provides connectivity to I/O system 34 and so forth. It should be noted that a single controller with appropriate components could provide the needed functions. As a consequence, the use of multiple I/O controllers should not be construed as a limitation on the scope of the present invention. I/O System 34, including display 36, keyboard (KB) 38, and other conventional pointing devices (not shown), facilitates displaying the results of the comparison of the two netlists to a user and allows the entry of data or the like into the computer. The communications network 32 provides interconnection between the computer and remote devices. For example, the communications network could be a wide area network, local area network, or the Internet. The storage 30 could be used for storing databases including the netlists. The databases could be read into the computer as needed by the CPU. It should be noted that the storage 30 instead of being coupled to the CPU bus 16 could be attached to communications network 30. This type of storage is sometimes referred to as Network Attach Storage (NAS), which is well known in the prior art and will not be discussed further.

Figure 2:
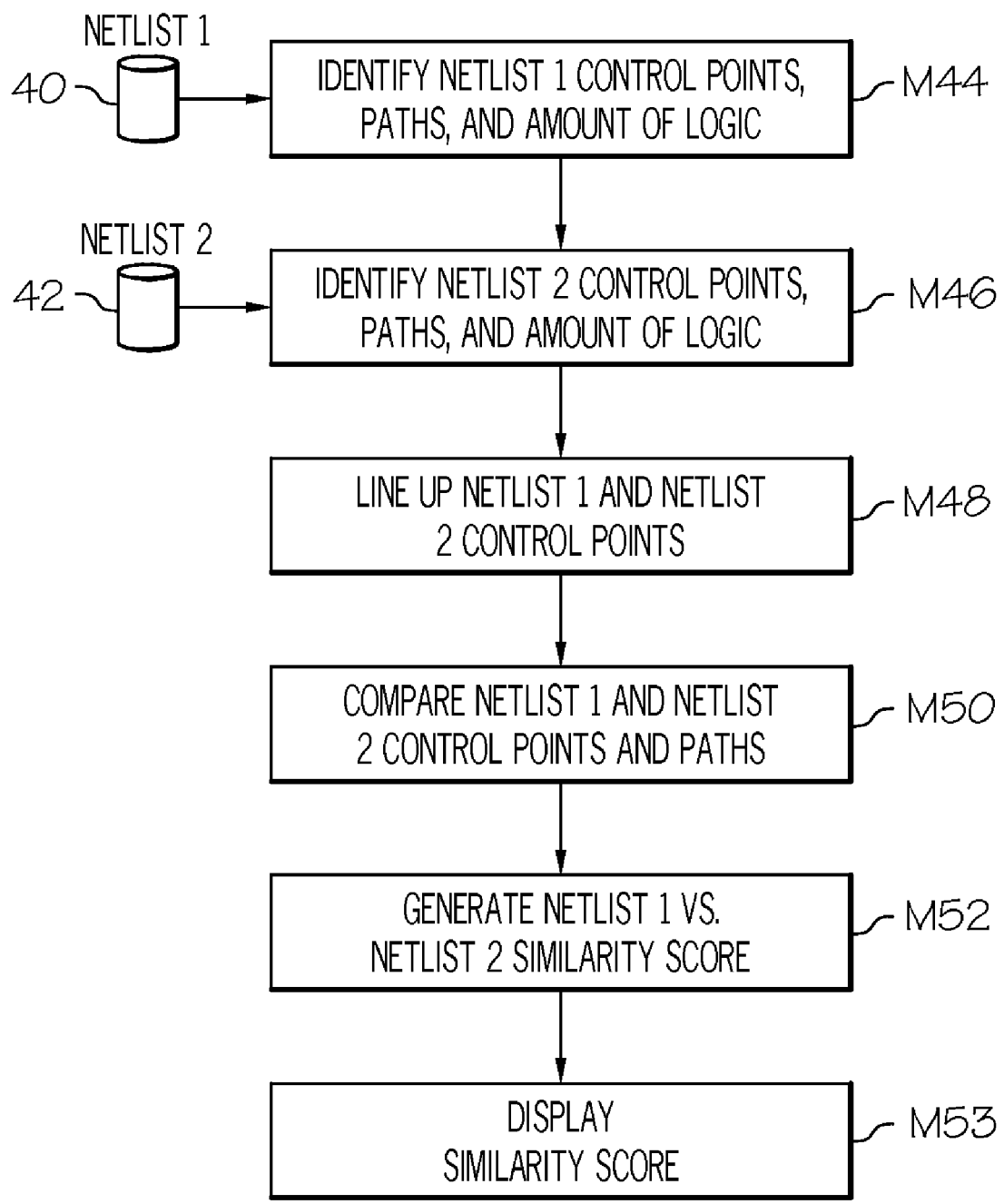
FIG. 2 depicts a flow chart of functional modules for implementing one embodiment of the invention.

FIG. 2 is a schematic diagram of function modules of Circuit Analytical System 20 (FIG. 1) according to an embodiment of the invention. Circuit Analytical System 20 analyzes Netlist 1 and Netlist 2. The analysis provides a similarity score which is a measure of the similarity between the two designs represented by the respective netlists. Netlist 1 is stored on Storage 40 whereas Netlist 2 is stored on Storage 42. It should be noted both netlists could have been stored on a single storage device or otherwise. As a consequence, the location and/or device whereat the netlists are stored is a matter of design choice and should not be construed as a limitation on the scope of the invention. To execute the method the netlists are read into memory 14 (FIG._1) from the storage. Module M44 identifies control points, paths, and amount of logic per path associated with Netlist 1. Module M46 identifies control points, paths, and amount of logic per path for Netlist 2. It should be noted "path" as used herein refers to a link between two control points. In addition, a path may be traced forward (source to sink) or backward (sink to source). Module M48 aligns control points in Netlist 1 and Netlist 2. Module M50 compares control points and paths in Netlist 1 and Netlist 2. Module M52 determines a similarity score of Netlist 1 versus Netlist 2. Module M53 displays the similarity score on display 36. The modules can be implemented in hardware, software, or both.

Referring to FIG. 3, a schematic diagram of modules to practice the generate function of module M52 (FIG. 2) is shown. Module M56 generates a baseline reference score for Netlist 1. Module M58 generates a normalized score for Netlist 2. Module M60 generates the similarity score which is based upon both the normalized score and the baseline score.

Figure 4B:
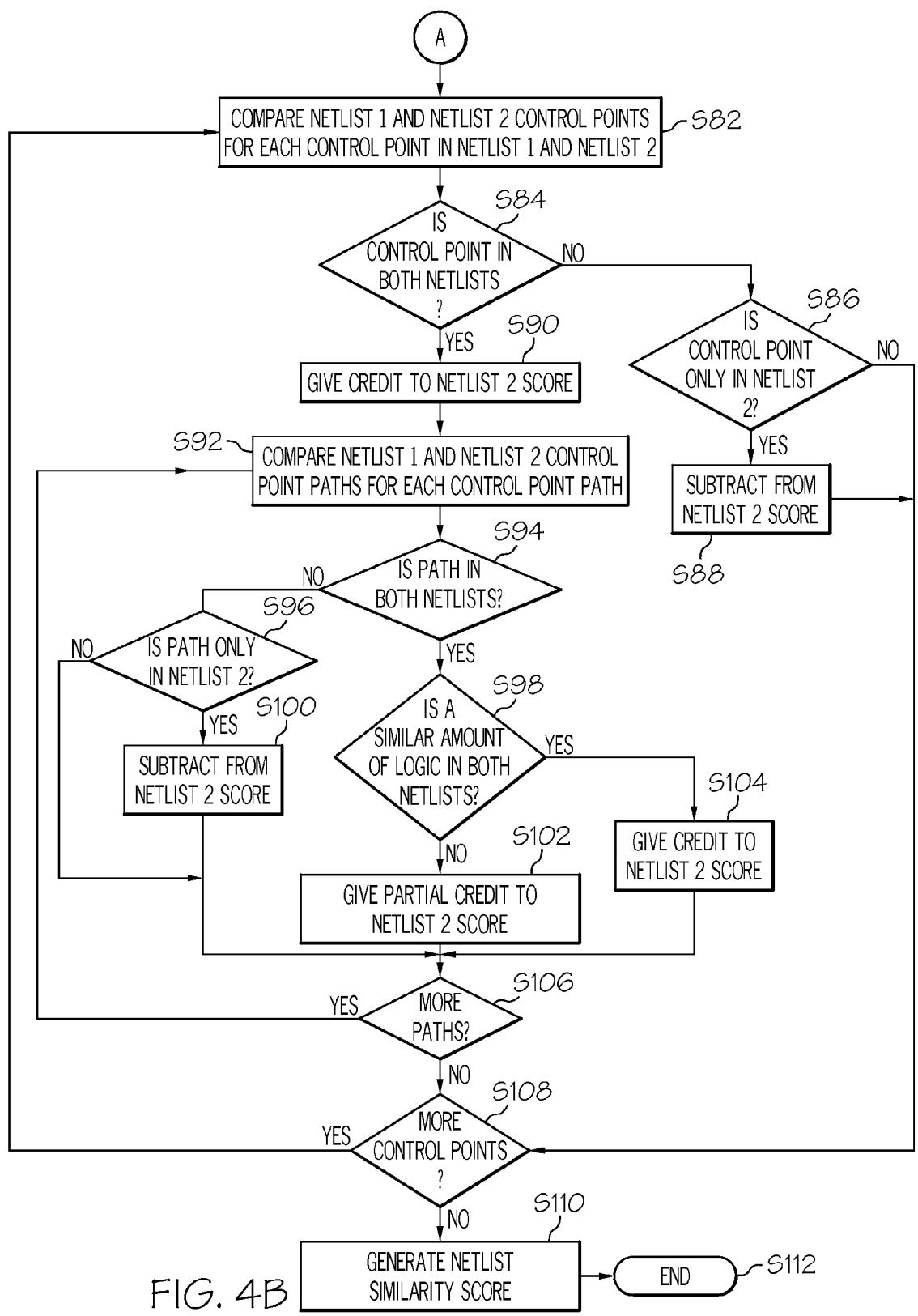

FIGS. 4a and 4b show a flow chart of a method for processing Netlist 1 and Netlist 2 according to teachings of one embodiment of the present invention. The steps in FIG. 4a process Netlist 1 and Netlist 2, whereas the steps in FIG. 4b perform the comparison and other functions to determine the similarity score. Netlist 1 is stored on storage 60 and Netlist 2 is stored on storage 72. As stated above, both netlists may be stored on the same storage facility and read into memory as is needed by the system in FIG. 1. The steps in FIG. 4a and FIG. 4b are practiced in Circuit Analytical System 20 (FIG. 1).

Still referring to FIG. 4a, in step S62 Netlist 1 is read into memory from storage 60. In Step S64 control points in Netlist 1 are identified. In Step S66 paths (termed control point paths) between control points are identified. Step S68 stores a numerical representation of the amount of logic per path. Step S68 can optionally ignore the impact of relatively small logic gates (including buffers and inverters) when calculating the numerical representation. These gates are generally easy to place, and it may not be desirable to have them detract from the comparison between netlists. Step S70 generates the Netlist 1 baseline score by summing numerical representations assigned to each control point path. In Step S74 Netlist 2 is read into memory from storage 72. In Step S76 control points in Netlist 2 are identified. In Step S78 control point paths in Netlist 2 are identified. Step S80 stores a numerical representation of the amount of logic per path in Netlist 2. Step S80 can also optionally ignore the impact of relatively small logic gates when calculating the numerical representation.

Referring now to FIG. 4b, in step S82 Netlist 1 and Netlist 2 control points are compared. In Step S84 it is determined if the control points are the same in both netlists. If they are not, the method exits along the "no" path into step S86 whereat it is determined if the control point is only in Netlist 2. If it is only in Netlist 2, step S88 is practiced by subtracting a predetermined value from the Netlist 2 score. If in step S84 the Control Point is in both Netlist1 and Netlist2, credit is given to the Netlist 2 score in step S90. In Step S92 Netlist 1 and Netlist 2 control point paths are compared. In Step S94, it is determined if Control Point Paths are in both Netlist 1 and Netlist 2. If it is not, the method enters step S96 whereat it is determined if the path is only in Netlist 2. If the path is only in Netlist 2, a predetermined value is subtracted from the Netlist2 score in step S100. In step S96, if the path is not only in Netlist2, the method exits along the "no" path to step S106.

Still referring to FIG. 4b, if the path is in both netlists at step S94, the method performs step S98 to determine if a similar amount of logic is in the path of both netlists. If the response to the inquiry in step S98 is "yes", the method enters step S104 whereat credit is given to the Netlist 2 score and the method performs step S106. If the response to the inquiry in step S98 is "no", the method enters step S102 whereat partial credit is given to the Netlist 2 score. The method then enters step S106 from step S102 and step S104. whereat it is determined if more paths are to be processed. If the response to step S106 is "yes", the method loops back to step S92 and performs steps previously described. If the response to step S106 is "no", the method enters step S108 whereat it is determined if more control points are to be processed. If the response to step S108 is "yes", the method loops back to step S82. If the response to step S108 is "no", the method moves to step S110 whereat the netlist similarity score is generated and then the method ends at step S112.

FIG. 5, including FIGS. 5a1, 5a2, 5b1, and 5b2, depicts an example, using comparison weightings, according to teachings of the invention. FIG. 5a1 depicts a graphical representation of a small portion of a netlist for a prior circuit design, whereas FIG. 5b1 depicts a graphical representation of a small portion of a netlist for a new circuit design. The task is to determine a similarity index or score for the new design based upon the prior circuit design. The prior circuit design (FIG. 5a1) includes one control point (Latch) L1, three control paths (L1 to L2, L1 to L3 and L1 to L4) and a two input logic AND gate (AND2) in path L1 to L2, a two input Logic OR gate (OR2) in path L1 to L3 and a four input logic AO (AO22) gate in path L1 to L4. To simplify the description, common components in FIGS. 5a1 and 5b1 are identified with the same notation. The new circuit design (FIG. 5b1) includes one Control Point (Latch) L1, three control paths (L1 to L2, L1 to L3 and L1 to L5) and a two input Logic OR gate (OR2), a six input logic AO gate (AO222) and a three input Logic NOR gate (NOR3). It should be noted that path L1 to L4 which is present in FIG. 5a1 is absent from FIG. 5b1. As a consequence, no weight is given for this path in calculating the normalized score for FIG. 5b1. In addition, a new path (L1 to L5) is added to the new circuit design (FIG. 5b1). As a consequence, the comparison of the two designs is penalized by subtracting a value from the Netlist 2 score.

FIGS. 5a2 and 5b2 show tables listing numerical values and entities associated with FIGS. 5a1 and 5b1. FIG. 5a2 lists values and entities associated with FIG. 5a1, whereas FIG. 5b2 lists values and entities associated with FIG. 5b1. Entities for calculating the baseline reference score and the normalized score are shown as column headings in FIGS. 5a1 and 5a2, whereas values assigned to these entities are listed in rows. The entities, viewing FIGS. 5a2 and 5b2 from left to right, are Paths, Control (CTRL) Points, Logic, Baseline Weight Factor (BWF—FIG. 5a2) and Normalized Weight Factor (NWF—FIG. 5b2). Referring to FIGS. 5a1 and 5b1, L1, a latch, is the sole control point which is assigned a BWF of 4. For path L1 to L2, the logic is AND2 which is assigned a BWF of 2. For path L1 to L3, the logic is OR2 which is assigned BWF of 2. Finally, for path L1 to L4, the logic is AO22 which is assigned a BWF of 2. It should be noted that partitioning the associated netlist into the named entities and assigning values are carried out by Circuit Analytical System 20 (FIG. 1) and associated flow diagrams. In addition, the assigned values are only exemplary and other values can easily be adopted by one of ordinary skill in the art without departing from the invention as set forth in the claims. The baseline reference score (BRS) is calculated next. The BRS is the sum of the BWF. For this example the BRS is 10, namely: (4 plus 2 plus 2 plus 2).

Referring now to FIGS. 5b1 and 5b2, the normalized score for the new circuit design will be addressed Like the prior circuit design analysis (FIGS. 5a1 and 5a2) discussed above, the new circuit design has a sole control point which is a latch assigned a Normalized Weight Factor (NWF) of 4 because it is common in both net lists. For path L1 to L2, the logic is OR2 which is assigned NWF of 2. For path L1 to L3, the logic is AO222 which is assigned a NWF of 1 because the amount of logic is significantly differently different for the path in each net list. The path L1 to L4 is deleted from the new design so it is implicitly assigned a NWF of 0. A new path L1 to L5 is added to the new design. The logic in the new path is NOR3 which is assigned a NWF of –2 because it is a new control path that does not exist in the prior circuit design. The normalized score for the new design is the sum of the NWF. For this example, the normalized score is 5 (calculated as follows: 4 plus 2 plus 1 minus 2). The similarity score is the normalized score divided by the baseline score (i.e. 5/10). When expressed as a percentage, it is 5/10 multiplied by 100 equals 50%. This means the new circuit design has 50% similarity to the old design.

A discussion giving an insight as to how the NWF were selected will now be given. As stated above this example used comparison weightings that can be customized, but were chosen for reasons described below. Latch instance L1 is the same in both netlists. As such, the BWF for the previous design and the NWF for the new design are the same, with a numerical value 4. Latch instance L1 begins three paths in each netlists. The path from L1 to L2 is physically similar in the new netlist even though the Boolean function is different. Due to the physical similarity, L1 to L2 paths are assigned the same value (2) in both netlists. The path from L1 to L3 still exists in the new netlist, but the physical structure of the path has changed because an AO222 (meaning six input AO gate) is significantly larger than an OR2 (meaning two input OR gate). In view of this change in physical structure, the path from L1 to L3 is assigned 1, a lower value than the 2 assigned to the L1 to L3 path in the prior netlist. As stated before, the path from L1 to L4 has been deleted from the new netlist. Therefore, no value is assigned for it in the new netlist. The path L1 to L5, not present in the prior netlist, is added in the new netlist. The new L1 to L5 path is assigned a much lower NWF of –2. The following can be deduced from the above: 1) Storage element pins and paths that contain a similar amount of combinatorial logic do not detract from the new netlist normalized score regardless of combinatorial function. 2) Both new and removed storage element pins and paths detract from the new netlist score. 3) Paths that have a different amount of combinatorial logic detract from the new netlist score, but not as much as a path that is completely new or a path that is removed.

The method can be used in many different ways, including (but not limited to) the following:

1) Schedule and resource forecasting as new netlists are generated and delivered for a project
2) Initial schedule and resource forecasting for a new project that is based upon a prior design (i.e. a re-design or metal only respin of a pre-existing design)
3) Comparing netlists before and after a step to see the complexity of the changes performed (e.g. before and after timing driven placement, before and after data hold path padding, etc.)
4) Determining what cells can be seeded with preplacement information in the new netlist to speed up netlist processing (i.e. latch and clock tree placement information may be saved for a large portion of the prior netlist and applied directly to the new netlist, reducing placement and clock build time for the new netlist).
5) Comparing clock paths to control points rather than data paths, to look for changes in the clocking structure between two netlists.

While the invention has been particularly shown and described with reference to an embodiment, it will be understood by those with skill in the art that various changes in form and detail may be made therein without departing from the spirit and scope of the invention. Any such changes are intended to be covered by the accompanying claims.

What is claimed is:

1. A method implemented on a computer that includes a memory, said method comprising:
   providing in said memory a first net list representing textual material for a prior circuit design;
   providing in said memory a second net list representing textual material for a new design;
   identifying structural components in the first net list and structural components in the second net list;
   generating a baseline score for said prior circuit design based on the structural components in said first net list wherein said baseline score includes a numerical value;
   generating a normalized score for said new design based on relation between the structural components in the first net list and structural components in the second net list wherein the normalized score includes a numerical value;

generating a similarity score for said new design based on the baseline score and the normalized score wherein the similarity score as a percentage includes a numerical value; and displaying said similarity score on a display screen.

2. The method of claim 1 including identifying control points, control paths, and Amount of logic in each control path for said first net list and said second net list.

3. The method of claim 1 wherein the baseline score is being generated by identifying control points within said first net list;

identifying control paths associated with said control points;

identifying amount of logic associated with each control path;

assigning baseline weight factors to control points, control paths and logic; and summing the baseline weight factors to generate said baseline score.

4. The method of claim 1 wherein the normalized score is generated by identifying control points within said second net list;

identifying control paths associated with said control points;

identifying amount of logic associated with each control path;

assigning normalized weight factors to control points and control paths in said second net list; and summing the normalized weight factors to generate the normalized score.

5. The method of claim 4 wherein the normalized weight factors are based upon similarities between control points and control paths in said first net list and control points and control paths in said second net list.

6. The method of claim 4 wherein the normalized weight factors include numerical values.

7. The method of claim 6 wherein assigning normalized weight factors include assigning like numerical values to control paths in the first net list and the second net list only if control paths in the first net list and the second net list are alike; and assigning to control paths in said second net list numerical values lower than numerical values allocated to control paths in said first net list only if control paths in the second net list are dissimilar to control paths in said first net list.

8. The method of claim 6 wherein lower numerical values include negative numbers.

9. The method of claim 1 further including discarding from said normalized score the effect of relatively small logic gates associated with the second net list.

10. The method of claim 9 wherein the relatively small logic gates include buffers and inverters.

11. The method of claim 1 further including printing on a printing device selective part of said method.

12. A method implemented on a computer that includes a memory, said method comprising:

providing in said memory a first net list representing textual material for a prior circuit design;

providing in said memory a second net list representing textual material for a new design;

generating a baseline score for said prior circuit design from said first net list;

generating a normalized score for said new design by comparing the first net list and the second net list;

generating a similarity score for said new design based upon the baseline score and the normalized score;

displaying said similarity score on a display screen; and expressing said similarity score as a percentage.

13. A system comprising:

a memory for storing at least Net list 1 and Net list 2 wherein Net list 1 and Net list 2 are textual representations of related prior and new electrical circuit designs;

a net list analytical system operatively coupled to said memory, said net list analytical system including a first module which parses Net list 1 to identify control points, control paths and amount of logic entities in each control path;

a second module which parses Net list 2 to identify control points, control paths and amount of logic entities associated with each control path;

a third module which compares Net list 1 and Net list 2 control points and control paths; and a fourth module that generates a similarity score based upon comparison results wherein the similarity score as a percentage includes a numerical value.

14. The system of claim 13 further including a fifth module which aligns Net list 1 and Net list 2 control points.

15. The system of claim 14 further including a sixth module which generates a baseline score for Net list 1, wherein said base line score includes a numerical value;

a seventh module that generates a score for Net list 2 that is normalized to said baseline score; and an eighth module responsive to the baseline score and normalized score to generate the similarity score.

16. The system of claim 13 wherein said first and second modules discard relatively small logic gates in identifying the amount of logic entities in each control path.

17. The system of claim 13 further including an I/O subsystem that includes a display device for receiving and displaying the similarity score.

18. A program product comprising:

a non-transitory readable storage medium having computer readable program code embodied therein, said program code including program code for identifying control points, control paths and amount of logic entities associated with Net list 1;

program code for identifying control points, control paths and amount of logic entities associated with Net list 2;

program code for comparing Net list 1 and Net list 2 control points and control paths;

program code for generating a similarity score based upon comparison results; and program code for displaying the similarity score on a display monitor, wherein said similarity score includes a numerical value.

19. A program product comprising:

a non-transitory readable storage medium including computer readable program code embodied therein, said program code including program code for identifying control points, control paths, and amount of logic entities associated with Net list 1:

program code for identifying control points, control paths, and amount of logic entities associated with Net list 2;

program code for comparing Net list 1 and Net list 2 control points and control paths;

program code for generating a similarity score based upon comparison results;

program code for displaying the similarity score on a display monitor and program code to express said similarity score as a percentage.

20. The program product of claim 19 wherein said program code for comparing Net list 1 and Net list 2 further includes program code that generates a reference baseline score for Net list 1; and program code that generates a score for Net list 2 normalized to the reference baseline score.

* * * * *